United States Patent [19]

Ralph

[11] 4,107,724
[45] Aug. 15, 1978

[54] SURFACE CONTROLLED FIELD EFFECT SOLID STATE DEVICE

[75] Inventor: John Ernest Ralph, Crawley Down, England

[73] Assignee: U.S. Philips Corporation, New York, N.Y.

[21] Appl. No.: 810,666

[22] Filed: Jun. 28, 1977

Related U.S. Application Data

[63] Continuation of Ser. No. 639,280, Dec. 10, 1975, abandoned.

[30] Foreign Application Priority Data

Dec. 17, 1974 [GB] United Kingdom ............... 54484/74

[51] Int. Cl.$^2$ ..................... H01L 27/14; H01L 31/00; H01L 29/80
[52] U.S. Cl. ......................... 357/30; 357/7; 357/11; 357/20; 357/22; 357/61; 357/62; 357/24
[58] Field of Search ...................... 357/7, 8, 11, 20, 60, 357/61, 62, 30, 22, 24

[56] References Cited

U.S. PATENT DOCUMENTS

| | | | |
|---|---|---|---|
| 2,869,054 | 1/1959 | Tucker | 357/20 |
| 3,128,530 | 4/1964 | Rouse et al. | 357/20 |
| 3,496,429 | 2/1970 | Robinson | 357/61 |
| 3,615,854 | 10/1971 | Aten | 357/30 |
| 3,620,832 | 11/1971 | Tevelde | 357/30 |
| 3,721,839 | 3/1973 | Shannon | 357/22 |
| 3,764,325 | 10/1973 | Tevelde | 357/30 |
| 3,787,718 | 1/1974 | Patterson | 357/20 |
| 3,925,803 | 12/1975 | Kobayashi | 357/22 |
| 3,947,707 | 3/1976 | Shannon et al. | 357/30 |

*Primary Examiner*—Andrew J. James
*Attorney, Agent, or Firm*—Frank R. Trifari; Algy Tamoshunas

[57] ABSTRACT

An electronic solid state device comprising an inhomogeneous body in which grains of semiconductor material are present. The contact between adjoining grains is such that in the interface regions there is continuity between the bulk material of the adjoining grains and the dominant current conduction paths in the body lie within the grains via said grain to grain contacts. At the surfaces of the grains adjoining said interface regions rectifying barrier forming means are provided to enable control of the said current paths by surface field effect depletion in the interface regions. Said means can be opposite conductivity type surface layers at or on the grains. In other devices said means are formed by adsorbed gas atoms, ions or molecules. The said control may be employed to yield photoconductive layers with controllable gain and speed of response, said layers being used, for example, in solid state imaging devices.

20 Claims, 15 Drawing Figures

SURFACE CONTROLLED FIELD EFFECT SOLID STATE DEVICE

This is a continuation of application Ser. No. 639,280, filed Dec. 10, 1975, now abandoned.

BACKGROUND OF THE INVENTION

This invention relates to electronic solid state devices, particularly but not exclusively photosensitive solid state devices such as solid state imaging devices and photodetector devices.

In many electronic applications there exists the requirement for an element the electrical conductivity of which can be controlled by means such as light radiation and capable of operating with a high speed of response and providing a high gain. For example, in imaging applications there exists a requirement for a photoconductive element having a high gain and a high speed of response. Conventional photoconductors, such as cadmium sulphide, have a relatively high grain but a relatively slow speed of response because the gain mechanism is due to carrier lifetime being increased by trapping effects.

During the last twenty years a considerable effort has been devoted to replacing the conventional vacuum tube image intensifier with an all solid state equivalent. The potential advantages are lower weight, cheaper components, lower operating voltages, more rugged structures and the possibility of large area devices in the form of thin panels. The basic features of all image intensifiers are a detector, an amplifier and a display. In modern vacuum tubes these are represented respectively by a photocathode, a secondary emission multiplier or an accelerator, followed by a phosphor screen. Solid state image intensifiers have normally been based on a secondary photoconductor as the detector and amplifier followed by an electroluminescent display. The solid state equivalent of secondary emission multiplication is avalanche grain and although this has been considered for the role of amplifier, in practice sufficiently high gains have not yet been achieved with adequate stability. Although useful image storage devices have been made using the photoconductor plus electroluminescence system, the response time, particularly at low light levels and high gains is too long for viewing moving objects.

Although hitherto some semiconductor devices have been produced in the form of an inhomogeneous body comprising grains of semiconductor material, for example a powder layer in a suitable binder, this invention is based on a new concept involving the recognition that if in an inhomogeneous body comprising grains of semiconductor material the formation of the body is effected in such manner as to control the nature of the grain to grain contacts with the deliberate addition in the body of certain conductivity modifying species at least in the vicinity of said grain to grain contacts then it is possible to form a structure in which field effect control of the conductivity can be obtained, said control being at least in part dependent upon external influences such as incident radiation, atmosphere, temperature, and incident electrical charge.

The invention is further based on the recognition that the employment of such field effect control of conductivity can lead to a new approach to image detection and amplification which provides the possibility of high gain, high detection efficiency, fast response time, variable integration time, and a wide range of spectral sensitivity.

The type of gain which occurs in multiplying devices such as electron multipliers and avalanche diodes is essentially instantaneous. An input current generates a real increase in the number of carriers available for conduction through some external load. Photoconductive gain on the other hand arises when the lifetime of one or both of the photogenerated carriers constituting the input of primary current is sufficiently large that an effective increase in carriers available for conduction occurs. If both carrier are simply collected by the electrodes, then one electron effectively traverses the external circuit and the gain is unity. For gains greater than unity at least one carrier must be replenished at an electrode, and the lifetime of one of these carriers must be greater than its transit time between the electrodes.

The said lifetime value can be increased by decreasing the recombination probability of the photoexcited electron-hole pairs. Materials with a suitably high value of lifetime for electrons have hole traps which when full exhibit a low capture cross section for electrons. These traps also reduce the effective hole mobility which reduces recombination at the electrodes.

If no other processes were involved then the decay time of the photoconductor after ceasing illumination would be the said carrier lifetime value. In practice much longer decay times are observed and are attributed to electron traps. If deep enough these may control the rate of recombination of free electrons rather than the hole capture process. They may also have the effect of reducing the effective mobility and thus the gain G. As a result values of gain $G \simeq 10^4$ have been observed for cadmium sulphide with decay times of several seconds, whereas from the geometry, mobility and voltage much higher gains should have occurred if the decay time corresponded to the carrier lifetime.

The present invention arises in part as a result of the basic concept of photoconductive gain being accepted, but measures being effected to provide a means of externally and continuously controlling the critical parameter, the carrier lifetime.

The requirements apart from gain of a photoconductor system may be summarised as follows:

a. a high efficiency of absorption of incident photons, b. a high efficiency of separation of photoexcited electron-hole pairs in short time $t_s$, c. a high mobility for one of the photoexcited carriers, d. ohmic contacts, e. efficient removal of the mobile carrier in a very short tim $(t_r)$ after a specified period of time $(t_i)$, f. accurate external control of this integration time $(t_i)$, g. $t_i$ should be $>> t_s$ and $t_r + t_i$ should be $<$ the integration time of the eye $(t_e)$ for viewing dynamic images.

Requirements (c) and (e) also require that deep bulk electron traps should be absent.

The expression for the gain is:

$$G = t_i/t_t$$

where $t_t$ is the transit time between the electrodes. The effective response time is equivalent to the integration time $t_i$ and may be varied over the range $t_r < t_i < t_e$ for viewing dynamic images. For image storage applications $t_i$ may be greater than $t_e$.

For meeting the above requirements, in particular the critical stage (c) structures falling within the following two classes are relevant. These are:

1. Those which are normally non-conducting in the dark and in which photo-generation gives rise to a non-equilibrium conducting state, and
2. Those which are normally conducting in the dark and which are placed in a non-equilibrium non-conducting state prior to photogeneration.

Normal photoconductors are in the first class and requirement (e) above could conceivable be achieved by field- or photo-emptying of trapped holes. It may also of course be achieved by elimination of the electron traps alone.

The second class involves some form of depletion of the free carriers by a stored charge to achieve the non-conducting state, while the progressive neutralisation of this stored charge by photogenerated carriers give rise to the photosensitivity. Requirement (c) may then be achieved by replacing the stored charge from an external source at specified intervals. The present invention is also based upon the discovery that it is in the second class of devices that charge storage effects already known in monocrystalline semiconductor device technology in junction field effect transistor (JFET) structures can be utilised to advantage in an entirely different area wherein the active body of the device comprises grains of semiconductor material.

DESCRIPTION OF THE PRIOR ART

Semiconductor devices operable in a charge storage mode are known, for example semiconductor target plates of vidicon camera tubes. Also certain junction field effect transistor (JFET) structures may be operated in a charge storage mode. In respect of the operation of a JFET structure in a charge storage mode reference is invited to United Kingdon patent specification No. 1,391,934. A JFET structure when used in a charge storage mode is an ideal imaging element because in addition to providing a high speed of response it also has appreciable gain and non-destructive interrogation which may be achieved either during a plurality of times in a frame interval by application of separate interrogation pulses or continuously during a frame interval by application of a constant interrogation voltage.

SUMMARY OF THE INVENTION

According to the invention an electronic solid state device comprises an inhomogeneous body in which grains of semiconductor material are present and contact between adjoining grains is such that in the interface regions there is continuity between the bulk material of the adjoining grains, the dominant current conduction paths in the body lying within the grains via the interface regions at grain to grain contacts and in a condition of thermal equilibrium in a quiescent state said conduction paths not being fully depleted, charge storage enabling means being present within the body at the surfaces of the grains at least locally adjoining the interface regions at the grain to grains contacts for enabling the control of the electrical conductivity of at last a portion of the body by surface field effect depletion of the conduction paths between adjoining grains in the interface regions at the grain to grain contacts in said body portion.

In a device in accordance with the invention the current conduction in the body between adjoining grains is not significantly dependent upon the physical properties of a barrier present at the interface at the grain to grain contact and extending transverse to the direction of current flow between said adjoining grains as may occur in some prior art devices employing powder grains of semiconductor material in a binder but is primarily controlled by electric field effect of a barrier which is formed by or associated with the charge storage enabling means and which extends substantially in the direction of current flow between said adjoining grains. It has been found that by arranging the configuration of a device comprising a body having grains of semiconductor material to enable such control of the current conduction at the interface regions at the grain to grain contacts significant advantages can result in various structures as will be described hereinafter.

Reference herein to a quiescent state is to be understood to mean the condition wherein external influences which can change the state of charge at the grain to grain contacts, for example illumination in the case of a light sensitive device or incident gas atoms in a gas detector device, are absent. Reference herein to 'continuity' between the bulk material of the adjoining grains is to be understood to mean that there is no significant interfacial layer other than the bulk material of the grains although in some instances there may be present small concentrations of atomic defects or impurities, for example impurity atoms or adsorbed gas atoms which were previously present at the surfaces of the grains prior to forming the body with the said grain to grain contacts. In general if the material of the grains prior to forming the said body, for example as a layer on a substrate, is such that the surface of the grains there is some form of initially present depletion means, for example a depleting surface layer or adsorbed atoms, molecules or ions, then in the formation of the body the grains are contacted together in such manner as to substantially remove these depleting means from the interface regions at the grain to grain contacts. The actual form of processing used in any particular case will be determined by the particular materials but the desired contacting may be obtained in some cases with a relatively small applied force between adjoining grains such as is obtained by a centrifuging process. In other cases the desired contacting may require a high temperature treatment even to the extent where the treatment approaches that of a sintering process or at least the early stages of sintering. In all cases the important factor is the nature of the grain to grain contact and in general in the devices in accordance with the invention the departure from prior art structures employing semiconductor grains lies in the combination of the form of the grain to grain contacts together with the means for modifying the conduction paths in the body via said contacts. Thus in many prior art devices employing semiconductor powder grains in layers of multi-grain thickness the operation is significantly dependent either upon an insulating layer between the grains, such as in A.C. electroluminescent devices, or intervening rectifying barriers being present between the grains, such as in a lead sulphide photoconductor device. In general in a device in accordance with the invention the charge storage enabling means must be present adjoining the interface region at a grain to grain contact in such a form that there are sufficient chargeable states per unit area to deplete the conduction path at the interface region at the grain to grain contact but external control of the occupancy of these states must be possible. This may be compared with some further prior art structures where such states are full in the device condition of thermal equilibrium condition in a quiescent state and the interface region at a grain to grain contact is fully depleted. Furthermore in terms of processing, devices in accordance with the invention differ in many instances from prior art structures in so far as the processing includes some deliberate step to apply the said charge storage enabling means and this step is normally effected after obtaining the desired continuity of the grain to grain contacts, for example after some heating step.

Some devices in accordance with the invention may be constructed for operation in a charge storage mode and comprise electrode means for applying a suitable potential pulse for charging the body in the vicinity of at least some of the grain to grain contacts and for deriving an output indicative of the electrical conductivity of at least a portion of the body as determined by the charge thus stored therein.

The charge storage enabling means present within the body at least locally at the surface of the grains adjoining the interface regions at the grain to grain contacts may be in one or more of a wide range of various different forms. Thus in a simple form said means may comprise an insulating layer present on said surface of the grains through which insulating layer an active agent such as a gas may diffuse or on the outer surface of which an active agent such as a gas may be adsorbed.

In another form the said means comprise an insulating layer present on said surface of the grains with some means for charge trapping built into the insulating layer at least in the part thereof adjacent the interface regions at the grain to grain contacts. In certain forms of a device in accordance with the invention the said charge storage enabling means present within the body at the surface of the grains at least locally adjoining the interface regions at the grain to grain contacts provide rectifying barriers at or adjacent said surface of the grains.

In general the devices in accordance with the invention in which the charge storage enabling means provide rectifying barriers may be considered in at least two main categories. The first category includes those devices where in the device structure there is no separate external electrical connection to the charge storage enabling means providing the rectifying barriers and thus it is not possible to directly control the potential applied to said means. The second category includes those devices where in the device structure there is some form of external electrical connection to the charge storage enabling means providing the rectifying barriers, for example as ohmic connection to the said means providing the rectifying barriers when in the form of surface layers on the grains, or an indirect connection to the means providing the rectifying barriers, for example a capacitive connection to such a kind of rectifying barrier providing means.

In general devices falling under the first category may be constructed for operation in a charge storage mode, that is operation whereby a charging of the grain to grain contacts is either periodically or intermittently carried out and the electrical conductivity of at least a portion of the thus charged body at a time following such charging and prior to the total recombination of the stored charge carriers is determined by some additional influence, for example by the introduction of free charge carriers generated by the absorption of radiation in the vicinity of the grain to grain contacts as occurs in a device constructed for imaging or photodetection purposes. In the operation of such devices in a charge storage mode the manner in which charging of the grain to grain contacts occurs depends on the nature of the means providing the rectifying barriers as will be described hereinafter but in general the operation is such that a potential difference is temporarily applied between connections to spaced portions of the body in order to obtain the desired charging of the grain to grain contacts.

In general devices falling under the second category may be constructed for operation in a charge storage mode or a continuous mode and the particular structures are constructed with a view to the intended operational mode. In such devices when designed for a charge storage mode of operation the manner in which the charging of the grain to grain contacts is effected may be different from the first category devices because a connection to the means providing rectifying barriers may be employed in order to deposit the charge. For example the charging may be effected by applying a pulse to temporarily reverse bias the rectifying barriers in the case where there is a substantially ohmic connection thereto, or in the case were there is a capacitive connection in series with the means forming the rectifying barriers by applying a pulse to temporarily forward bias the rectifying barriers and charge the series connected capacitor means so that on collapse of the pulse the charge is distributed between said capacitor means and the rectifying barriers in the vicinity of the interface regions at the grain to grains contacts. In these cases when the body is in the form of a layer there may be a plurality of connections all ohmic or all capacitive each forming a connection to the means providing the rectifying barriers of an elemental portion of the layer. It will be appreciated that the connections to the means providing the rectifying barriers must be such that following the charging these connections should be mutually isolated in order to avoid charge leakage from one elemental portion of the layer to another elemental portion of the layer.

Devices falling under the said second category may advantageously be constructed for a continuous mode of operation, the potential applied to a connection to the means providing the rectifying barriers being employed to modulate the current flow by field effect depletion of the conduction paths between adjoining grains in the interface regions at the grain to grain contacts.

In one form of a device of said first category, in which there is no external electrical connection to the means providing the rectifying barriers the distribution of the grains in the body and the configuration of the rectifying barriers is such that following application of a charging potential difference of suitable magnitude across at least a portion of the body charge is stored in depletion regions associated with the rectifying barriers in the vicinity of at least some of the grain to grain contacts in said portion and is effective in modifying the dominant electrical current conduction paths via the grains in said portion. In one form of the operation of such a device an interrogation potential difference applied across the said portion is of the same applied polarity as the charging potential difference but of smaller magnitude. In general the charging will be effected such that, in the case of an idealised grain to grain contact between two spherical grains with a 'neck' portion in the interface region, the charge will be symmetrically distributed in the interface region between the two grains. However within the scope of the invenion are also included those devices in which a certain asymmetry occurs in the charge distribution, for example due to selective ion adsorption at one side of the grain to grain contact due to the drop in potential across said contact.

In the said one form of the device in which there is no external electrical connection to the means providing the rectifying barriers, the distribution of the grains and the configuration of the rectifying barriers may be such that following application of a charging potential difference of suitable magnitude the charge stored in the depletion regions is effective in substantially blocking the said dominant electrical current conduction paths via the grains in said portion of the body.

Devices in accordance with the invention in which the charge storage enabling means provide rectifying barriers at or adjacent the grain surfaces means may be constituted in various different manners. In some structures the rectifying barriers are provided within the grains by converted surface layers present adjoining the interface regions at the grain to grain contacts, said surface layers being of a conductivity type opposite to that of the main bulk of the grains in which the current conduction paths are present. Thus, for example, the grains may be of n-type silicon or n-type gallium arsenide having n-type surface regions formed outside the interface regions at the grain to grain contacts, for example formed by heating the n-type silicon or gallium arsenide grains to obtain the desired grain to grain contacts in an atmosphere of an acceptor dopant for silicon or gallium arsenide respectively. Other examples are grains consisting initially of n-type lead oxide or n-type lead sulphide in which either as part of or subsequent to a treatment employed to obtain the desired continuity between the bulk material of adjoining grains at the grain to grain contacts heating is effected in oxygen to form p-type surface layers at the grain surfaces.

In other arrangements the rectifying barriers are provided by material applied on the grain surfaces at least locally adjoining the interface regions at the grain to grain contacts. Said applied material may be present in the form of a coating layer provided on the grain surfaces at least locally adjacent the interface regions at the grain to grain contacts. Alternatively said material may be present as a relatively high resistivity material substantially filling the intergrain spaces in the body.

In some devices the applied material present at least locally on the grain surfaces and the grains form p-n homojunction rectifying barriers. Thus the body may comprise contacting grains, for example of silicon, gallium arsenide, lead oxide, lead sulphide, of one conductivity type coated with the same basic material but of the opposite conductivity type.

In other forms of the structures in which the rectifying barriers are provided by applied material present at least locally on the grain surfaces adjoining the interface regions at the grain to grain contacts the material and the grains form p-n heterojunction rectifying barriers. In one example the body comprises grains of n-type zinc oxide at least locally coated with a p-type material. For the p-type coating material when using n-type zinc oxide grains there exist various possibilities, for example using p-type lead iodide, p-type cuprous oxide, p-type lead oxide, p-type zinc telluride for the coating material. When using p-type lead iodide for the coating material, for example by using non-stoichiometric lead iodide (excess iodine) it is possible to vary the effective acceptor action of said coatings. In another example the body comprises grains of p-type lead iodide at least locally located with n-type zinc oxide or n-type lead oxide.

In a further example the body comprises grains of n-type cadmium sulphide at least locally coated with a material selected from the group consisting of p-type cuprous sulphide, p-type zinc tellurde, and p-type lead iodide. One other example is where the body comprises grains of p-type zinc telluride at least locally coated with a material selected from the group consisting of n-type cadmium sulphide, n-type zinc selenide, n-type zinc oxide, and n-type lead oxide.

In any of the said devices comprising coatings on the grain surfaces or surface layers of the opposite conductivity type at the grain surfaces a suitable filler may be present in the intergrain spaces. In some examples to be described hereinafter a conducting filler is employed in order to provide a connection to the rectifying barrier providing means.

Examples will now be given of devices in which rectifying barriers are provided by high resistivity semiconductor material having opposite conductivity type properties to the contacting grains and substantially filling the intergrain spaces, the dominant current conduction paths in the bodies of said devices lying within the grains and via the interface regions at the grain to grain contacts. In one example the body comprises contacted n-type zinc oxide or n-type cadmium sulphide grains having high resistivity p-type zinc telluride in the intergrain spaces. In another example the body comprises contacted p-type zinc telluride grains having high resistivity n-type cadmium sulphide or high resistivity n-type zinc selenide in the intergrain spaces. Alternatively the intergrain spaces may be filled with a high resistivity organic semiconductor material, for example a dye, having opposite conductivity type properties to the material of the contacted grains.

When using such high resistivity fillers in the intergrain spaces it is important that the resistivity is chosen to be sufficiently high that (a) the dominant conduction paths in the body are via the grain to grain contacts, and (b) in a device for operation in a charge storage mode, following charging, redistribution of charge stored at the interface regions in the vicinity of the grain to grain contacts to adjoining areas does not occur to a substantial extent.

In still further forms of the device in accordance with the invention the applied material present at least locally on the grain surfaces is of semiconductor material of the same conductivity type as the material of the grains but of different composition. In one example the body comprises grains of n-type zinc oxide having a rectifying heterojunction forming applied coating of n-type cadmium sulphide or n-type selenide. In another example the body comprises grains of p-type zinc telluride having a rectifying heterojunction forming applied coating of p-type cuprous oxide. In general the relationship between the material of the grains and the material of the coating must be such that for n-type grains the coating has a larger work function than the material of the grains and for p-type grains the coating has a smaller work function then the material of the grains.

In other forms of the device in which the rectifying barriers are provided by material applied at least locally on the grain surfaces adjoining the interface regions at the grain to grain contacts the body comprises grains at least locally coated with an organic dye having semiconductor properties.

In other forms of the device in which the rectifying barriers are provided by material applied at least locally on the grain surfaces adjoining the interface regions at the grain to grain contacts the body comprises grains at least locally coated with an organic dye having semiconductor properties.

In other forms of the device in accordance with the invention the charge storage enabling means comprise at least on the surface portions of the grains adjoining the interface regions at the grain to grain contacts at least one adsorbed gas species selected from the group consisting of atoms, ions and molecules. In order that in these devices charge transfer can occur from the grains to the adsorbed gas atom, ion or molecule, it is necessary that when using n-type grains the electrochemical potential of the adsorbed species is greater than that of the grains and when using p-type grains the electrochemical potential of the adsorbed species is less than that of the grains. Such charge transfer produces field effect depletion of the grain surface portions in the vicinity of the interface regions at the grain to grain contacts and thus serves to control the dominant current conduction paths in the body via the interface regions at the grain to grain contacts. The said charge transfer can be effected in some devices when applying a charging potential difference across a grain to grain contact. The charging mechanism may be such that in the formation of the device, ions, for example, oxygen ions, are adsorbed on the surface potions of the grains in the vicinity of the interface regions at the grain to grain contacts. On applications of a suitable charging potential difference across at least a portion of the body the ion adsorption is increased due to the forward biasing of part of the effective rectifying barrier at the surface portions in the vicinity of the grain to grain contacts. This is the ion equivalent of the charging mechanism which occurs when there is a p-n junction at the said surface portions. Thus in the case of using n-type grains, for example n-type zinc oxide grains in which oxygen ions can be absorbed the charging mechanism involves the supply of a neutral oxygen ion from the surroundings of the grain to grain contact and the supply of an electron from within the grain. The charging thus causes field effect depletion of the dominant conduction paths via the interface regions at the grain to grain contacts. This effect may be utilised in many applications, for example in device structures constructed for operation in which photo-desorption of the said species can be effected under the control of incident radiation. Other possible applications where the voltage induced adsorption effect provided by a device structure in accordance with the invention can be employed are those in which desorption can also be voltage induced. A device structure in which a voltage induced adsorption effect occurs may be constructed for gas detection, gas transport, or even employed as a voltage controlled catalytic device.

In another form of a device in accordance with the invention in which the charge storage means form rectifying barriers at the grain surfaces and said barriers are provided by an applied coating on the grain surfaces, in addition to the applied coating on the grain surfaces the charge storage enabling means further comprise adsorbed gas ions, molecules or atoms on the surface of the applied coating. The applied coating may be of any of the previously referred to p-n heterojunction forming materials and in one example the grains are of zinc oxide having on the surfaces at least adjoining the interface regions at the grain to grain contacts a coating of p-type lead iodide on the surface of which adsorbed oxygen ions are present.

In another form of a device in accordance with the invention in which the charge storage means form rectifying barriers at the grain surfaces and said barriers are provided by an applied coating on the grain surfaces, in addition to the applied coating on the grain surfaces the charge storage enabling means further comprise gas ions, molecules, or atoms present within the bulk of the coating material. The applied coating may be of any of the previously referred to p-n heterojunction forming materials. The operation of such a device may be based upon voltage induced diffusion of the gas species in the coating material, in some cases the diffused species serving to alter the conductivity of the coating material.

In general the inhomogeneous body of a device in accordance with the invention may have various different internal configurations, for example it may be present as a system of substantially spherical grains joined by narrow necks, a system of interconnected rod-like grains, of a system of geometrically closely fitting grains which have limited regions of good electrical contact. The external configuration of the body may be for example, a layer of several grains thickness, but in general may be of any appropriate shape for the intended device application.

The body may comprise, either separate from or forming part of the charge storage enabling means a material acting as a filter in the intergrain spaces. Such a filler may give the body mechanical strength and also provide the grain surfaces with a protection from undesirable external active species. Examples of fillers having no active effect on the grain to grain contacts for example of a zinc oxide powder layer device are dental wax, polyethylene wax, and silicone oil.

As an alternative to the body comprising a filler in the intergrain spaces it may comprise a binder. Binders may be of the same material as a filler but differ in so far as they do not completely fill the intergrain spaces. The result may be completely closed pores, pores linked by constrictions or even open channels up to several grain diameters wide. The effect is to provide access for gases or even liquids to the interior of the layer together with considerably improved mechanical strength.

DESCRIPTION OF THE DRAWING

Embodiments of the invention will now be described, by way of example, with reference to the accompanying diagrammatic drawings, in which.

DETAILED DESCRIPTION OF THE INVENTION

Figure 1:
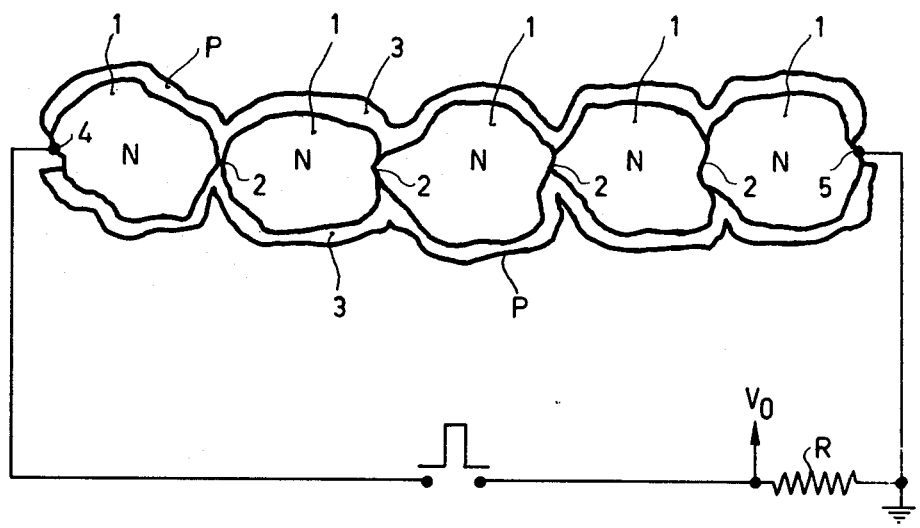
FIG. 1 is a schematic representation of part of an electronic solid state device in accordance with the invention.

Referring now to FIG. 1, the electronic solid state device in accordance with the invention comprises a body having a plurality of n-type semiconductor grains 1 present on a glass substrate (not shown) and forming substantially ohmic contacts with each other at the grain to grain contacts. In this body the dominant current conduction paths are via the grains and the interface regions at the substantially ohmic grain to grain contacts. The grain to grain contacts are such that there is continuity of the n-type grain material and no rectifying barrier is present in a direction transverse to the direction of the current flow between adjoining grains in the interface regions. In the schematic representation shown in FIG. 1, five grains 1 present in the body are shown together with four grain to grain contacts 2. In the vicinity of the interface regions at the grain to grain contacts 2 there are present rectifying barrier forming means and in the present example these are represented as p-type layers 3 which extend over the surfaces of the grains with the exception of the interfaces at the grain to grain contacts. Ohmic electrode connections 4 and 5 shown as being present on the outer two grains 1 and in practice a system of interdigitated electrodes may be provided on the body in ohmic contact with the n-type grains.

Figure 2:
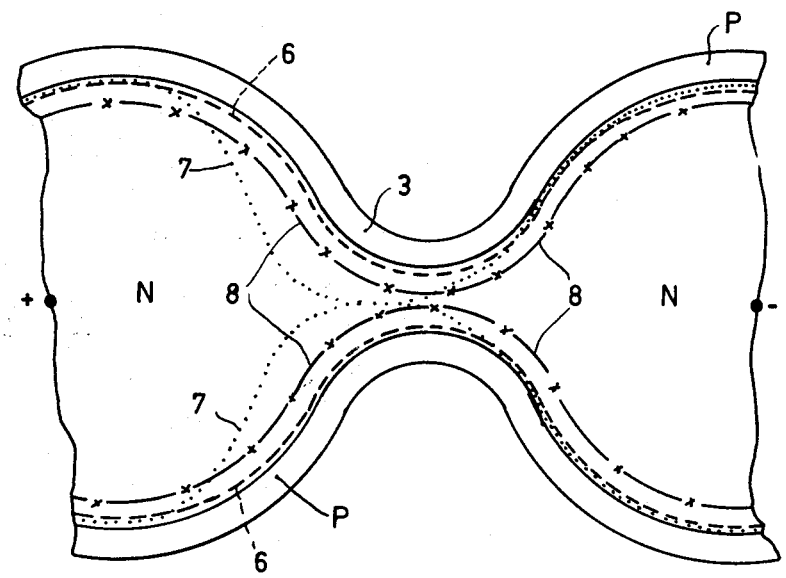
FIG. 2 is another schematic representation of part of an electronic solid state device in accordance with the invention.

FIG. 2 is a schematic representation of an idealised single grain to grain contact of the form shown in FIG. 1 and in showing a finite width for the conduction path between adjoining grains at the interface region at the grain to grain contact indicates that in a device in accordance with the invention when in a state of thermal equilibrium in a quiescent state the dominant current conduction paths at the grain to grain contacts are not fully depleted. In a practical layer this degree of depletion of the grain to grain contacts will have a statistical spread due to the distribution of grain zinc, neck size, coating thickness and coating doping level. The conjunction path is in a so-called 'neck' at the interface region and it will be appreciated that in the schematic representation of FIG. 2 the thickness of this neck is shown considerably increased with respect to the thickness of the p-type layers 3.

Operation of a device of the form shown in FIGS. 1 and 2 in a charge storage mode will now be described. For the purpose of this description it will be assumed that initially the grain to grain contacts are in an equilibrium charge state and the dominant current conduction paths in the layer are in the grains 1 via the interface regions at the grain to grain contacts 2. Excess charge is then induced in the layer by applying a resetting potential pulse between the ohmic electrode connections 4 and 5. In this generalised embodiment the conduction path via the p-type layers has a considerably higher resistivity than the dominant current conduction path via the grains 1.

Assume that the polarity of the applied resetting pulse is such that the connection 4 is positive and the connection 5 is negative. At the grain to grain contacts shown in FIG. 1 the presence of the high resistivity p-type layers 3 modifies the electric field distribution since due to the potential drop along the conducting channels in the necks of the interface regions at the grain to grain contacts (see FIG. 2 where the channel is shown of finite width), the p-n junction portions between the grains 1 and the p-type layers 3 at the left hand side of the grain to grain contacts 2 become reverse biased and the p-n junction portions at the right hand side of the grain to grain contact 2 become forward biased. At the forward biased p-n junction portions negative charge is transferred to the p-type layer 3 and at the reverse biased p-n junction portions depletion regions associated therewith extend into the grains. In FIG. 2 the extent of the depletion regions in adjoining grains at a grain to grain contact when in an equilibrium charge condition prior to applying a resetting pulse is indicated by broken lines 6 and the extent of the depletion regions during the application of the resetting pulse $V_R$ is indicated by continuous lines of dots 7. Following the application of theresetting pulse the excess charge stored in the depletion regions associated with the p-n junction redistributes and the depletion regions containing this distributed charge extend into the grains substantially symmetrically distributed about the contact, these depletion regions being indicated by the chain lines 8 in FIG. 2. The magnitude of the resetting potential pulse $V_R$ serves to determine the extend to which the depletion regions 8 extend into the conducting channel in the neck at the interface region between adjoining grains and in the present example these depletion regions are shown almost meeting each other from opposite sides of the grain to grain contact so that the conduction path between the two adjoining grains via the channel in the neck at the interface region at the grain to grain contact is almost blocked. For some applications it is desirable to completely deplete the conduction channels at the grain to grain contacts and even to the extent of over depleting the conduction channel so that operation thereafter is beyond the so-called pinch-off condition. For these applications the resetting pulse is chosen accordingly.

It will be appreciated that, although not shown in FIG. 2, the depletion regions extend on both sides of the rectifying junction between the n-type grains 1 and the p-type layer 3, that is the depletion regions in all three illustrated cases also extend in the p-type 3. For a device in which the p-type layer is a substantially continuous coating or a substantially continuous surface layer then ideally the configuration of the grains with respect to the grain to grain contacts and the properties of the p-type coating or layer are chosen such that when a charging pulse is effective in fully depleting the neck portions in the interface regions at the grain to grain contacts the p-type coating or layer is also fully depleted. This is particularly important when the manufacture of the device is such that in addition to forming good ohmic electrode connections to the n-type material of the grains there also is formed when applying the p-type coating or p-type surface layer a connection therewith by the same electrode means. Thus the acceptor concentration, thickness and diffusion voltage associated with the coating or surface layer are chosen accordingly.

After the charge redistribution the charge stored in the grains in the vicinity of the grain to grain contacts may be reduced, for example by free charge carriers generated by absorption of incident radiation in the depletion regions 8 or within a minority carrier diffusion length thereof. This reduction in stored charge has the effect of causing the depletion regions 8 to contract thus further opening the conductive channels 6 in the necks at the interface regions at the grain to grain contacts.

Electrical signals indicative of the electrical conductivity of the body between the electrodes 4 and 5 as determined by the charge stored in the grains at the grain to grain contacts 2 in the intermediate portion of the body can be obtained by means of applying continuously or intermittently an interrogtion potential difference $V_I$ between the contacts 4 and 5, the magnitude of $V_I$ being considerably smaller than the resetting pulse $V_R$.

The device may be of a suitable structure whereby it can be interrogated in a non-destructive read-out manner either continuously or many times subsequent to the application of the resetting potential pulse $V_R$ respectively by applying a continuous D.C. bias $V_I$ between the electrode connections 4 and 5 or by applying a series of pulses of magnitude $V_I$ between said electrode connections.

When using such a device as an optical detector, in the normal charge storage mode a series of resetting potential pulses $V_R$ are superimposed on a constant D.C. bias $V_I$ as indicated diagrammatically in FIG. 2. The outut voltage $V_O$ is measured across the resistor R.

Figure 3A:
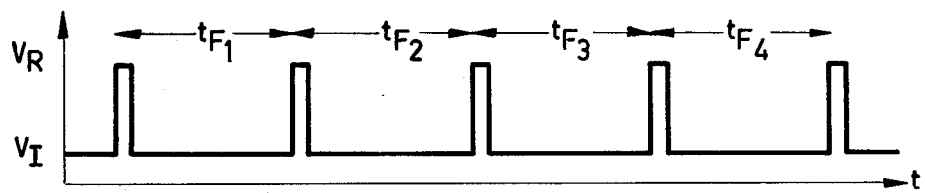
FIGS. 3a and 3b show the voltage waveforms arising in connection with the operation of a device in accordance with the invention in the charge storage mode.
Figure 3B:
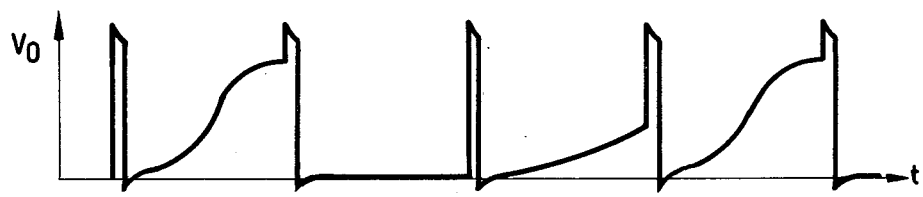

FIGS. 3a and 3b respectively show the input voltage waveform and the output voltage waveform associated with one such mode of operation. In this preferred form of operation the magnitude and duration of $V_R$ is chosen such that the depletion regions 8 formed in the grains at the grain to grain contacts are effective in blocking the said electrical current conduction paths between the electrode connections 4 and 5 via the grain to grain contacts for an interrogation potential of smaller magnitude than $V_R$. Following application of the resetting charging potential $V_R$ the body will integrate the free charge carriers generated by incident radiation and the output voltage $V_O$ measured while applying the constant D.C. interrogation voltage $V_I$ is a measure of the free charge carriers generated by absorption of radiation in he depletion regions and within a minority carrier diffusion length thereof in the period following application of the resetting pulse $V_R$. FIG. 3b shows the output voltage $V_O$ during frame intervals $t_{F_1}$, $t_{F_2}$, $t_{F_3}$, $t_{F_4}$ etc. During frame interval $t_{F_1}$ the incident radiation intensity is high, during the frame interval $t_{F_2}$ no radiation is incident, during the frame interval $t_{F_3}$ radiation is incident but of an intensity smaller than in frame interval $t_{F_1}$, and during frame interval $t_{F_4}$ radiation is incident and of an intensity corresponding to the intensity in frame interval $t_{F1}$. The output voltage $V_O$ rises during $t_{F_1}$ due to the integrating effect of the body and saturates when the grains have fully discharged before falling to zero at the end of $t_{F_1}$ on application of the resetting charging potential $V_R$ to block the conduction paths between the electrode connections 4 and 5. As the incident radiation is absent during $t_{F_2}$ the output voltage $V_O$ remains at zero and rises again during $t_{F_3}$ when radiation is incident, the body again integrating the free charge carriers generated during $t_{F_3}$. The value of the output voltage $V_O$ will depend upon the value of the load resistor R and the total charge passing through the load resistor R during a frame interval will be much greater than the charge displaced from the grains by the incident radiation during that interval. When R is small it is possible for the charge grain to exceed $10^6$.

The device shown in FIGS. 1 and 2 may be considered as a series of junction field effect transistor (JFET) structures having an external source connection at one end of the series formed by the electrode connection 5 and an external drain connection at the other end of the series formed by the electrode connection 4, the source and drain regions of an individual transistor structure being constituted by two adjoining grains at a grain to grain contact and the gate region of such an individual transistor structure being formed by the p-type regions on the grains at said grain to grain contact 2, the gate rectifying junctions being formed by the junctions between the p-type regions 3 and the n-type grains 1. The channel regions of the individual JFET structures are present at the grain to grain contacts and are periodically blocked in the previously referred to preferred mode of operation. In the device shown in FIGS. 1 and 2 the gates of the individual JFET structures may be considered as electrically floating because in each such structure there is an extremely high series resistance between the gate and each of the source and drain. For description of the operation of a plurality of JFET structures as an imaging device in a charge storage mode reference is invited to United Kingdom patent specification No. 1,391,934 (PHA 20552).

The device structure shown in FIG. 1 may be suitably employed in an imaging device by forming the body as a thin layer of several grains thickness and applying appropriate ohmic electrode connections to the grains at various portions of the layer. The intergrain spaces may be occupied by a filler material which is of non-conducting or conducting material. When such a material is electrically conducting it is important that such material does not electrically connect the ohmic electrode connections to the grains of any one imaging element formed in the layer in such a way as to form a lower resistance path than is present via the grains.

It will be appreciated that in a device of the 'two terminal' form of arrangement shown in FIGS. 1 and 2 in which each gate of the plurality of JFET structures is electrically floating and for each imaging element there are two ohmic electrode connections to the n-type material of the grains, the p-type layer or coating 3 to be effective in the operation need not be continuous but may just be locally present in the vicinity of the interface regions at the grain to grain contacts 2. Thus in a modified form the manufacture of the device is controlled such that the p-type coating or surface layer is formed locally at these areas.

In another embodiment the p-type coating or surface layer which constitutes the rectifying barrier forming means is replaced by a high resistivity p-type filler material in the intergrain spaces. Again in such a device it may be important that this filler material does not electrically connect the ohmic electrode connections to the grains of any one elemental portion in such a way as to form a lower resistance path than is present via the grains.

In other embodiments the device structure shown in and described with reference to FIGS. 1 and 2 is suitably modified and constructed as a 'three terminal' arrangement by forming a connection to the rectifying barrier forming means. This connection may be a direct ohmic connection, for example to a p-type surface coating or layer such as the layers 3 in FIGS. 1 and 2, to a p-type filler material which forms the rectifying barriers with n-type grains. Alternatively the connection may be a capacitive connection to the means forming the rectifying barriers, for example, in a device as shown in FIGS. 1 and 2 by means of a connection to a conductive filler material with the interposition of an insulating layer on the p-type layers 3 on the grains.

In a charge storage mode of operation of these devices in which a connection is made to the means forming the rectifying barriers the charging of the grain to grain contacts may be effected via said connection. In the case of a direct connection the potential applied to the said connection is such as to temporarily reverse bias the rectifying barriers. The connections are isolated following application of the charging potential. In the case of a capacitive connection the potential applied is such as to temporarily forward bias the rectifying barriers to charge the series capacitive means. Following such charging the charge redistributes itself between said capacitive means and the rectifying barriers. These devices may be constructed as multi-element devices in a common layer, for example in an imaging device, provided suitable isolation can be maintained between the means forming the rectifying barriers of the elemental portions following the charging. Alternatively these devices may be constructed for a continuous mode of operation where the potential applied to the connection to the means forming the rectifying barriers is employed to modulate the current flow via the interface regions at the grain to grain contacts by field effect depletion of the grain material in these regions.

Figure 4:
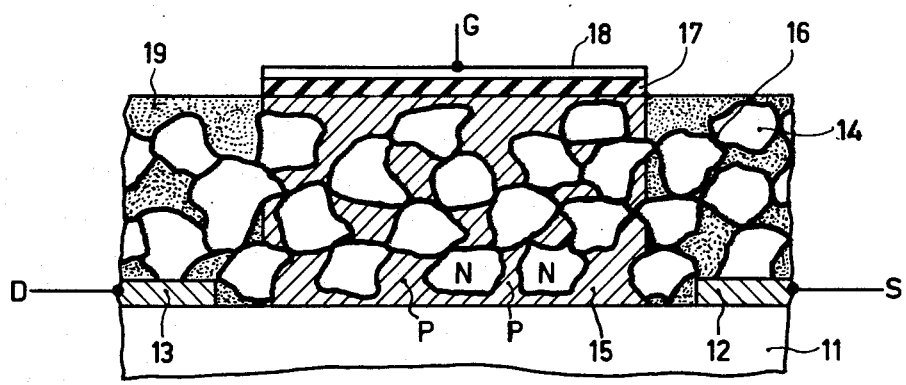
FIGS. 4 and 5 show in schematic cross-section parts of further electronic state devices in accordance with the invention.

FIG. 4 shows in cross-section part of an embodiment in which a capacitive connection is made to means forming the rectifying barriers. This device comprises a glass substrate 11 having thereon a deposited electrode pattern comprising a source part 12 and a drain part 13. On the glass plate and electrode pattern there is a layer of n-type semiconductor grains 14 of several grains thickness. The grains have been heated together to form intimate ohmic grain to grain contacts 16. On a part of the surface of the layer of grains there is an insulating layer 17 having a metal gate electrode layer 18 thereon. In the intergrain spaces directly below the gate electrode 18 there is a high resistivity p-type semiconductor filler 15 and in the intergrain spaces beyond this portion there is an insulating filler 19. This device may be operated in a charge storage mode by periodically applying a resetting charging potential to the gate electrode G and applying an interrogation voltage between the electrodes 12 and 13. The device as shown may form a single element device or one element of an imaging device present in a layer in which the filler material varies in alternate portions between the p-type semiconductor material 15 (below the gate electrodes) and the insulating material 19. In a modified form the gate electrode or electrodes 18 is or are applied directly on the layer surface in contact with the p-type filler.

Figure 5:
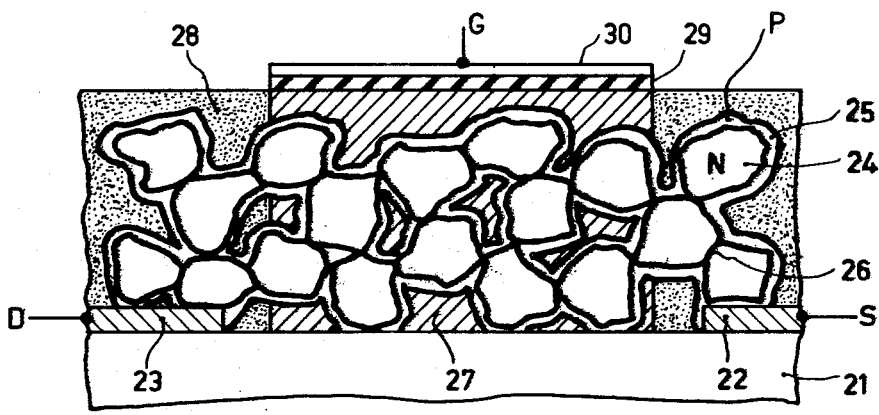
Figure 6A:
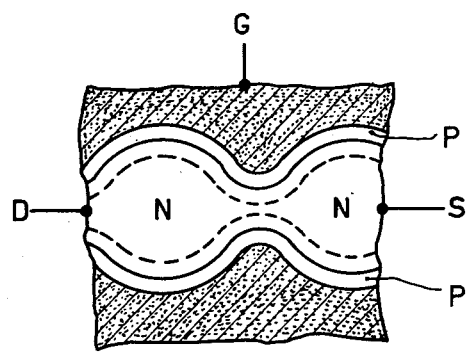
FIGS. 6a–6g show in schematic cross-sectional form various alternative configurations that can be employed in the structure of a device in accordance with the invention.
Figure 6B:
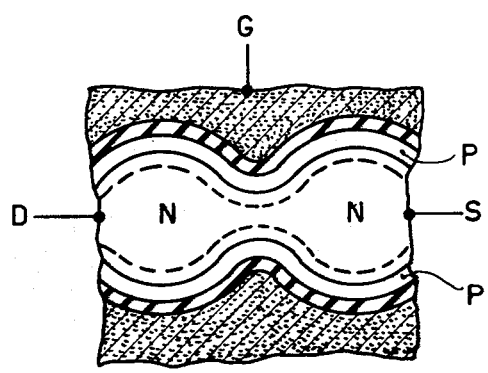
Figure 6C:
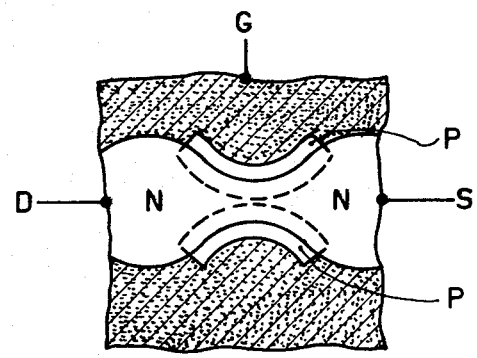
Figure 6D:
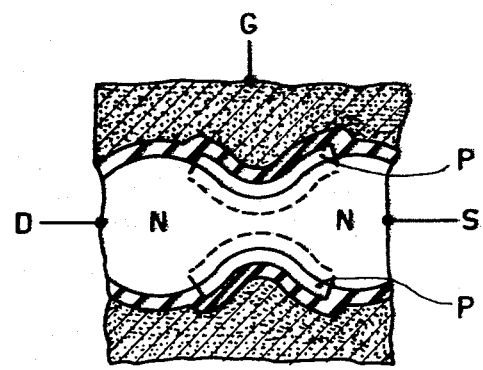
Figure 6E:
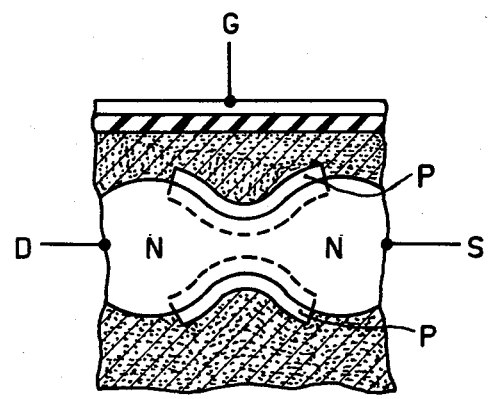
Figure 6F:
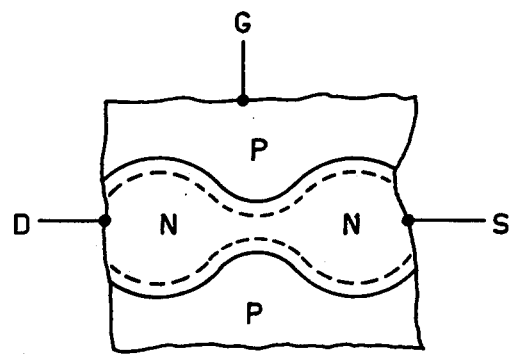
Figure 6G:
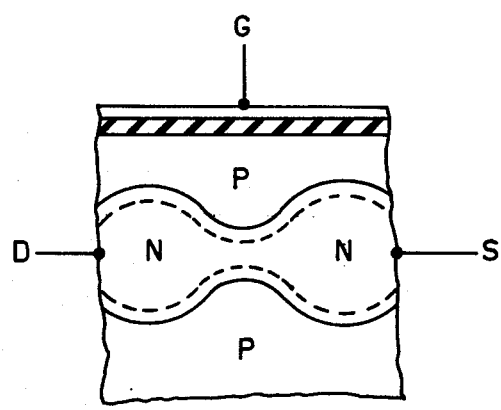

FIG. 5 shows a further embodiment of a device constructed for operation in a charge storage mode with a charging potential applied to a gate connection to the means forming the rectifying barriers. This device comprises a glass plate 21 having thereon an electrode pattern comprising a source part 22 and a drain part 23. On the electrode pattern and the surface of the glass plate there is a layer of n-type semiconductor grains 24 of several grains thickness. The grains have been heated together to form intimate ohmic grain to grain contacts 26. The surfaces of the grains beyond the interface regions at the grain to grain contacts comprise p-type coatings 25 formed during and/or after said heating step. In the intergrain spaces in a central portion there is a conductive filler 27 serving to contact the p-type coatings. Beyond this central portion the intergrain spaces contain an insulating filler 28. On the surface of the layer above the central portion there is an insulating layer 29 having thereon a metal gate electrode 30. Operation and use of this device structure is substantially as in the previously described embodiment (FIG. 4).

FIG. 6 shows in outline form various possibilities for device structures in which the charge storage enabling means comprise an opposite conductivity type surface coating or layer which provides rectifying barriers at the grain surfaces and a connection is made to the means forming the rectifying barriers. In all these Figures conductive fillers are shown cross-hatched. Thus in FIG. 6a a conductive filler is employed to establish the electrical connection from a gate connection G to the p-type surface layer on the grains. In FIG. 6b an insulating layer is present on the surface of the p-type surface layer. In FIG. 6d an insulating layer is present on the localised p-type surface layer and on the remaining surfaces of the grains. In FIG. 6e the structure is similar to FIG. 6c with the difference that the gate connection is to a metal layer separated from the conductive filler by an insulating layer. In FIGS. 6f and 6g the rectifying barrier forming means consist if a p-type semiconductor filler and otherwise only differ in respect of the gate connections. These basic structures may be employed in various devices constructed for operation in a charge storage mode, either single element or multi-element, and in devices constructed for operation in a continuous mode.

As previously mentioned the charge storage enabling means may be formed by an adsorbed gas atom, ion or molecule. Thus in one embodiment which is a modified structure of FIG. 1 and 2 the p-type layer 3 is replaced by adsorbed oxygen ions. This device structure relies in its operation on voltage induced adsorption of oxygen ions. It may be constructed for operation in a charge storage or continuous mode and in both cases incident radiation producing desorption of oxygen ions. Also as previously mentioned the charge storage enabling means may comprise in addition to an opposite conductivity type surface layer or coating on the grains an adsorbed gas species on the surface of the opposite conductivity type surface layer or coating. Thus the layer structure of the device shown in FIGS. 1 and 2 may be suitably adapted to provide a p-type coating on the grain surfaces on the surface of which coating adsorbed oxygen ions are present. In another form the p-type coating on the grain surfaces contains an absorbed gas species and the operation of such a device may be based upon voltage induced diffusion of the gas species in the p-type coating.

A discussion of some further considerations of intergrain JFET embodiments will now be given. Although the embodiments as so far described are in terms of solid state imaging applications the intergrain JFET structure as described may be utilised in a wide range of semiconductor devices based on powder layers of several grains thickness. One powder material that has been specially selected for investigation is zinc oxide. The contact between the n-type grains of zinc oxide in a layer are regarded as essentially ohmic unless these grains have been coated before contact. This is, the thickness of any interface layer present is considered to be sufficiently thin so that tunnelling is highly probable and that such a layer does not give rise to any depletion effects.

In the surfaces of the n-type grains are coated after contact as shown in FIG. 2, with a material whose work function is greater than that of the grain then a depletion region will be formed below the grain surface. As already stated the geometry of the contact, the coating and the depletion region would be expected to vary from one contact to another. Any grain to grain contact may consist of many sub-contacts with different characteristics, and extreme cases such as very small grains linking two larger ones must be considered. The structure shown in FIG. 2 is intended to represent the general case in which the area of the undepleted channel linking two grains is reduced by the presence of the coating and its resultant depletion region. The effective length of the contact region would depend greatly on the local geometry and effects such as grain growth and neck growth during a heating treatment at a temperature corresponding to the early stages of sintering. FIG. 2 shows a typical situation at a p-coated n-grain neck which might be formed at such a temperature.

If the gate layer, shown as layer 3 in FIG. 2, forms a homojunction and said layer has an acceptor concentration $N_a$ and the grain donor concentration is $N_d$ then the total thickness of the transition region consisting of the two depletion regions would be:

$$d = \left[ \frac{2\epsilon\epsilon_o(V_d + V_a)(N_a + N_d)}{e \, N_a N_d} \right]^{\frac{1}{2}}$$

where
$V_d$ is the work function difference between the n and p regions
$V_a$ is the external applied potential on the gate
$\epsilon_o$ is the dielectric constant of free space (8.85 × $10^{-12}$ Farad/m)
$\epsilon$ is the dielectric constant of the n and p regions.

A more complex expression is necessary for a heterojunction forming gate layer, but for simplicity the assumption is made that the acceptor concentration of the coating $N_a$ is much greater than $N_d$ then the depletion region is mostly in the n-type material and $$d = \left[ \frac{2\epsilon\epsilon_o}{e \, N_d} (V_d + V_a) \right]^{\frac{1}{2}}$$

which is the normal Schottky barrier expression. This approximation may be expected to be valid for metal coatings, coatings of highly conducting semiconductors and for adsorbed layers where each adsorbed atom or molecule contributes one chargeable electron state.

If the total gate capacitance is $C_g$ and a charge $q$ is deposited on the gate then $$V_a = \frac{q}{C_g} \text{ and}$$

$$d(q) = \left[ \frac{2\epsilon\epsilon_o}{e \, N_d} (V_d + \frac{q}{C_q}) \right]^{\frac{1}{2}}$$

and the conducting channel will be completely depleted when $$d(q) >> 2r$$

where $r$ = the radius of the channel.

It will be assumed that the depletion region remote from the contact plays no part, although of course a progressive depletion of the bulk of the grain must occur for increasing surface charge. For a layer of zinc oxide grains using the given equation for the heterojunction gate case and some reasonable values for the various parameters the depletion layer depth ($d$) may be estimated. For a doner concentration $N_d = 10^{18}$ per cm$^3$, a diffusion voltage $V_d = 0.5$ eV and taking $\epsilon = 10$ for zinc oxide the value of $d$ is approximately 230 A. For a typical zinc oxide powder the mean grain size is about 0.25 micron so that the depletion depth would be approximately 10% of the diameter of the grain.

As previously stated the gate "coating" may take various forms and to be effective as a heterojunction the chief requirement is a work function greater than that of the grain. The work function difference between the two materials is $V_d$ and together with $N_d$ controls the depletion width $d$ at zero applied volts $V_a$. In order that the gate can store charge the reverse bias leakage current of the gate junction must be small. For this the value of $d$ must be sufficiently large that tunnelling through the barrier is insignificant. The thermal emission current $i_e$ must also be small so that $V_d$ should be $>> kT$. Zener breakdown due to tunnelling from the valence band to the conduction band and thermal generation are highly improbable because the band gap of zinc oxide is large (3.2 eV) and tunnelling via deep traps should also be of low probability since such deep traps have been shown to have a low concentration.

The three terminal mode of JFET operation implies an accessible gate contact. This may be provided in some powder layers as described but the 'floating' gate principle may be more convenient, and has already been described. In applying this principle a number of factors must be considered which may not arise in a conventional single crystal, homojunction JFET. These are, inter alia:

a. since each grain to grain contact JFET has a different geometry, degree of coating, etc. the voltage at which each gate forward biases, and the degree of channel depletion resulting, will vary from one to another.

b. since there are large numbers of such contacts in series/parallel the applied voltage will distribute itself in a very complex way both in space and time within the layer.

c. since the gate coatings must be relatively non-conducting in order not to short the contacts between the grains, then asymmetrical charging of the coating in the region of the contacts may be expected with long time constants for redistribution.

In the conventional JFET with a p-type semiconductor gate, the negative gate charge necessary for channel depletion would be in the form of negative space charge due to ionised acceptors. Adsorbed atoms or ions on the other hand may store charge in the form of a changed charge state. Alternatively the charge may be stored by some internal transition or polarisation of a complex molecule or the bond between some interacting pair of adsorbed species. There are therefore several classes of charge storage mechanism which may be conveniently listed as follows:

a. stable — for example free carrier depletion in a semiconductor, charging of a non-volatile ion or molecule.

b. metastable — for example arrangement of the structure or bonding at the surface.

c. unstable — for example the adsorption of further atoms or ions from an external source, or charging of a volatile ion or molecule.

One might expect that the first of these would show a fast re-establishment of equilibrium after some disturbance such as gate charging or subsequent illumination since only free carrier movement is involved. On the other hand (b) and (c) may involve some such slower processes. For the purpose of image intensification, where a fast response is required, a p-type semiconductor gate on n-type grains with no deep traps present in the structure would be ideal. The non-volatile adsorbed organic molecule such as a dye may also be suitable, and even some volatile gate coatings such as adsorbed oxygen may be fast enough.

An important difference between a conventional single crystal heterojunction and the coated grain system should be emphasised. The incident radiation will in general be strongly scattered by the grains, and combining this with possibly very thin coatings of the gate material, the process of absorption may be distributed over a depth very much greater than the normal bulk absorption length. However all absorption steps may still occur close to a collecting junction. It also follows that radiation may approach the junction regions from both inside and outside the grains, so that a heterojunction 'window effect' as is shown in the art may contribute to the spectral sensitivity.

In general it would appear that in the grain systems under consideration the detection efficiency of incident photons might be rather low for various reasons:

a. minority carriers produced by photons absorbed in the central portions of grains may not have a sufficiently long diffusion length to reach the surface depletion region before recombination.

b. even if they are collected and reach the surface they may not neutralise charge in the vicinity of the interface region at the grain to grain contact where their effect would be registered as a change in conductivity.

c. similarly absorption in the coating may not occur sufficiently near the interface regions to be effective.

The situation is clearly complex and generalisation is difficult. However it does appear probable that the collection efficiency in the grains should be greatest when the depletion regions are fully expanded after charging. It would also appear advantageous to have adequate conductivity of the coating so that charge redistribution can occur over the whole grain surface. On the other hand changes in surface charge must not be communicated over many grains or picture information is lost. For this reason there are distinct advantages in having a discontinuous grain coating, limited chiefly to the grain surfaces adjacent the interface regions at the grain to grain contacts as present in some of the embodiments described.

For operation in a charge storage JFET mode a conducting channel has to be present between the source and drain wich is open when the excess charge on the gate is zero. For this to be the case in the grain to grain contact the channel radius $r$ at the interface region must be greater than the depletion layer width $d$. Although the barrier height ($V_d$) of the junction can be adjusted to some extent by the choice of gate material, one of the variables in the expression wich determines $d$ which can readily be controlled is the grain carrier concentration which is a characteristic of the starting material of the grains and may be controlled by doping or stoichiometry control. The value of $r$ on the other hand can be increased by neck growth during a heating treatment corresponding to the early stages of sintering of the layer, and this may have secondary advantageous in removing interface layers of adsorbed species and possibly annealing of interface damage or reconstructed surfaces.

The grain size distribution may also be important in various ways. For a given voltage applied to a powder layer the voltage at a grain to grain contact will clearly depend on the number of grains between the electrodes. Voltage dependent effects such as the two terminal gate charging mode described earlier would therefore be expected to be sensitive to grain size. In order to keep the operating voltage low for a given electrode spacing the grain size should not be too small. The collection efficiency for photo-induced electron-hole pairs should be higher for grains which are sufficiently small that the radius of the underpleted portion of the grain is less than the minority carrier diffusion length. Again the total number of grain contacts per picture element should be large for good uniformity and this favours a small grain size. A small distribution of particle size might be important to keep the number of particles constant along the shortest conducting paths between the electrodes. On the other hand if small grains between large grains are important to form the channels of integrain JFET's then a wider spread of grain size may be desirable. Thus the grain size is potentially very important and a compromise between various factors may have to be made in any particular case.

It will be appreciated that the body structures in accordance with the invention as described above may be employed in various electronic solid state devices. In particular these body structures have applications where central of gain by externally applied means rather than by choice of the basic material is important. For photoconductive operation such as is employed in photodetector or imaging devices the device structures are advantageous as will be evident from two further embodiments of which the manufacture will now be described.

In the manufacture of a first embodiment in which the charge storage enabling means are adsorbed oxygen ions and the semiconductor grains in this example aare of ZnO, but in other similar examples the grains may be of CdS, PbO, other oxides and II–VI compounds. The zinc oxide powder wich consists of PHOTOX 83 manufactured by New Jersey Zinc Company for coating Electrofax copying paper is suspended in isopropyl alcohol by ball milling in a plastic mill using agate rollers for between 15 minutes and 1 hour. A layer of the n-type ZnO grains of about 1 – 5 microns thickness is deposited onto an interdigitated electrode structure consisting of a platinum layer on a glass or fused silica substrate, by centrifuging the powder from the suspension in a 12 inch diameter centrifuge operating at 700 to 1000 r.p.m. for a period of between 1 and 10 minutes. The large particles and aggregates initially are removed from the suspension by centrifuging at 700 r.p.m. for a few seconds with no substrate present prior to the deposition of the layer. Etching of the powder before milling in 1% concentrated HCl in distilled water for 1 minute is carried out to remove any coating of zinc carbonate. The grain size distribution before etching peaks near 0.4 micron, and etching reduces this to about 0.3 micron.

The layer shows strong photoconductivity at this stage and normally shows a conductivity increase of five to six orders of magnitude under illumination with an unfiltered 250 watt low pressure mercury lamp at a distance of 40 cm. in room air, with a rise time of about 0.1 to 0.5 seconds and a decay time of 10 to 50 seconds. Drying in an oven at 50° C for several days or at 100° C to 200° C for about 1 hour increases the decay time to many hours. Heating at 300° C to 800° C in air decreases the decay time to a few tens of milliseconds and this may be attributed to the removal of residual surface coatings on the grains. For devices treated at higher temperatures of 600° C to 800° C the dark current is also considerably increased.

The application of a voltage pulse with a rise and decay time of a few milliseconds to a ZnO layer of this type in air generally causes a considerable reduction in the conductivity of the layer. Immediately after the layer is deposited and has partially dried at room temperature for about 1 hour the dark current is too low for the effect of a voltage pulse to be observed. After illumination, provided the photocurrent decay is sufficiently slow that is, before the 300° C – 900° C heat treatment, a voltage pulse of between 200 and 400 volts and 50 to 100 milliseconds in duration will produce a conductivity reduction of up to three orders of magnitude. After the high temperature heat treatment a 150 volt pulse of 5 to 10 milliseconds duration will produce a two orders of magnitude decrease of conductivity from the increased steady dark conductivity level.

In all cases illumination at a wavelength at or a little shorter than the absorption edge of ZnO (that is between 3700 A and 4100 A) restores the conductivity to its normal photoconducting level. In the dark the depressed conductivity level increases slowly back to the normal dark level in a time ranging from a few hundred milliseconds to several minutes. The increase in conductivity by illumination after pulsing is approximately proportional to the product of the intensity and the exposure time, that is an integration occurs.

The layer may be operated in this way in oxygen or air. In nitrogen the above effect of the voltage pulse disappears after a few minutes. Exposure to room air causes the fast photoconductive response, the increased dark conductivity and the response to short, low voltage pulses to progressively change over a period of several hours to the behaviour described above before the high temperature heat treatment.

The ZnO layers may be made by spraying a suspension of the powder in a solution of a binder such as PLIOLITE (a polystyrene butadiene copolymere made by the Goodyear Rubber Company) in a sovent such as xylene onto the interdigitated electrode structure. Such layers show long photoconductive decays up to minutes or hours, but also show a response to voltage pulses similar to that described above for a binderless layer before the higher temperature heat treatment. This heat treatment cannot be given because the Pliolite binder would dissociate.

In the manufacture of a second embodiment in which the grains are also of n-type zinc oxide the rectifying barrier forming means are surface coatings of opposite conductivity type on the grains. The same method of forming the layer is employed up to and including the high temperature heat treatment between 300° C and 900° C. The layer is then immersed in solution of cupric sulphate in water using 0.01 to 10 gms. of $CuSO_4$ per liter of distilled water. After washing with distilled water the layer is immersed in sodium hydroxide solution having a pH of 11 and hydrazine hydrate is added to reduce the $CuSO_4$ to $Cu_2O$. The $Cu_2O$ deposits on the ZnO grains to give a pale brown layer.

Approximately 0.25 grms. of $CuSO_4$ per liter of water gives a $Cu_2O/ZnO$ weight for weight ratio of about 0.3%. This reduces the dark conductivity of the ZnO layer in the absence of adsorbed oxygen by about four or five orders of magnitude compared with an uncoated layer.

Such layers show a similar response to a voltage pulse as described above for the uncoated layers in air. If the $Cu_2O$ coating is too thick, for example greater than 1.5% weight for weight of ZnO, the conductivity is too low to observe the effect of the pulse. If the $Cu_2O$ is too thin, for example less than 0.05% weight for weight of ZnO, then the layer conductivity is so high that the voltage pulse causes a destructively high current pulse to flow.

Especially for the thinner coatings ambient gases, for example oxygen can still be adsorbed on the grains and cause effects as described in the preceding embodiment. To see the effect of the $Cu_2O$ coating alone and to prevent degradation due to $H_2O$, $CO_2$, etc., encapsulation or filling of the layer is desirable. This can be done by an inert material such as polyethylene wax or silicone oil which is transparent to the radiation to which the layer is sensitive. In the case of coatings, such as $Cu_2O$ having a band gap much less than the ZnO, the sensitive region is shifted into the visible region.

In the manufacture of another embodiment which is a modification of the last described embodiment the zinc oxide layer is immersed in an aqueous solution of cuprous chloride (CuCl) and neutralized hydrazine hydrate giving a pH value of approximately 4. The copper is exchanged with the zinc to give a p-type cuprous oxide coating on the n-type zinc oxide grains. Such layers show a similar response to a voltage pulse as the previously described layers. Binderless layers of zinc oxide grains coated with $Cu_2O$ by the second described method show a low dark conductivity in air similar to that for uncoated layers. However in vacuum only a partial recovery of conductivity is observed depending on the thickness of the $Cu_2O$ layer. The $Cu_2O$ to ZnO weight for weight content of the layers can be measured as a function of the $CuSO_4$ concentration using absorption spectroscopy. The thickness of the $Cu_2O$ layer is not precisely known but it should be a small fraction of the ZnO grain diameter. As the $Cu_2O$ concentrations in the layer are incresed the photoconductivity in air and vacuum decrease by up to three orders of magnitude. The dark conductivity in vacuum also decreases, whereas the dark conductivity in air is too small to measure.

For the deposition of the zinc oxide power layers it has been found that the spinning of a suspension of the powder grains in polyvinyl alcohol using a conventional photoresist spinning apparatus gives better uniformity, packing and reproducibility. It is necessary to subsequently bake off the polyvinyl alcohol in air and this is then followed by an outgassing in vacuum under illumination. This results in a greatly increased dark current in air which suggests that this method of forming the layer yields larger areas of grain to grain contacts then may be obtainable when forming the layers by spraying or centrifuging.

Details of the manufacture of other powder layers suitable for device structures employing a-type zinc oxide grains will now be described. Zinc oxide powder, as in the proceding embodiment, consisting of Photox 83, is subjected to etching by ball milling. 10 gm. of the powder with 30 ml of water are ball milled for 30 minutes and then made up to 200 ml. of suspension while still stirring 2.5 ml. of concentrated hydrochloric acid is added and stirring continued for 1 minute. The acid is then filtered off and the powder is then washed with 0 liter of distilled water and then dried thoroughly. 2 gm. of the etched ZnO is ball milled with 5 ml. of 4% by weight polyvinyl alchol in water, 4 ml. of ethanol and 4 ml. of methanol for 2 hours. The mix is then dropped onto an aluminium or platinum interdigital electrode system present on a fused silica or glass substrate until the surface of the substrate is covered. The mix is then spun off using a photoresist spinning apparatus, for example at 4,000 r.p.m. for a substrate of 17 mm × 17 mm. and at 1700 r.p.m. for a substrate of 50 mm. × 50 mm. This process gives a layer of a mean thickness of about 1.5 microns. To obtain thicker layers more deposition and spinning stages can be carried out, each lasting about 1 minute. The layer is then baked in air at 400° C for 1 hour. A resultant residue on the layer, the identity of which is not established, is removed by irradiating the sample with ultra-violet light for several minutes while present in a vacuum of about $10^{-5}$ Torr. After this treatment the conductivity and photosensitivity of the sample are found to have both increased by up to four order of magnitude. The sample is then coated with a dye having p-type conductivity properties, this dye being material available commercially as Eosin Bluish, or Eesin Yellowish, or Rose Bengal, in one example by immersing for 1 minute in a solution of the dye which is 10% of the saturated concentration in water. The sample is then removed from the due solution, washed in distilled water and dried thoroughly. Various experiments have been carried out using Rose Bengal dye coatings of different thickness. The thickest dye coatings produced effects which appeared to be due to the dye alone. For the very thin coatings the decrease of resistivity on illumination with an ultraviolet lamp both in air and vacuum was similar to that for an uncoated layer. The sensitivity of the photoconductivity was progressively increased in the region of the dye absorption band as the dye coating thickness was increased. The major effect of the dye was to considerably decrease the photoconductivity decay time both in air and in vacuum. Also greatly decreases response time on re-exposure to air in the dark was observed.

Some experimental details will now be given of methods of applying a coating of p-type lead iodide on the grain surfaces of n-type zinc oxide in a body comprising a powder layer as prepared by the method described in the preceding example. In a so-called 'wet chemical' method and powder layer is first prewetted by dipping it into distilled water, then immersing it in a solution (0.33 M) of Pb(NO$_3$)$_2$ for 2 minutes. The sample is then washed and immersed in a solution (0.66M) of potassium iodide for 30 seconds. The sample is then dried.

In a second method the lead iodide is formed by precipitation at room temperature from a solution (0.1M) or Pb(NO$_3$)$_2$ and a solution (0.2M) of potassium iodide. After a washed and drying stage 0.5 gm. of the lead iodide powder is formed in a suspension by a ball milling process with 30 ml. of propan-2-ol (IPA). The suspension is centrifuged for 15 seconds at 1800 r.p.m. and then the remaining liquid is pipetted over the zinc oxide powder layer on the substrate. After balancing the sample is centrifuged for 10 minutes at 1500 r.p.m. The liquid is siphoned off and the sample dried.

In another method 2 g,. of the lead iodide powder as prepared in the previous example is ball milled with a solution of 12.5% Pliolite 5B in 13 ml. of xylene. This is then sprayed onto the zinc oxide powder layer until the layer becomes of a bright yellow colour. Thereafter the sample is dried at 50° C for 24 hours.

In a further method the lead iodide is applied on the zinc oxide powder layer by evaporation deposition in vacuum. 0.05 gm. of lead iodide is placed in a tungsten boat which is situated in the vacuum chamber 200 mm. from the zinc oxide powder layer on the substrate and is heated at approximately 500° C. Suitable deposition may be effected even when the zinc oxide layer on the substrate is at room temperature.

In another example using lead oxide grains which initially are n-type and have a size of between 0.5 to 1.0 micron, the powder grains are baked at 400° C in air for 1 hour to convert them to p-type material. 2.8 gm. of the prepared powder is milled for 1 hour with 5 ml. of 4% polyvinyl alcohol in water, 4 ml. of ethanol and 4 ml. of methanol. This is then spun at 500 r.p.m. and dried. After a baking and illumination under vacuum stage the layer of lead oxide on its electrode system and substrate can be coated with an n-type organic dye, for example a dye available commercially as Rhodamine B, by immersing it in a solution of the dye in water which is 16% of the saturate concentration.

Other means of grain coating such as vapour transport of the coating material, deposition of the metal vapour and subsequent oxidation, reactive vapour deposition, electrolytic deposition, electroless deposition, may be used. Other coating materials such as PbO, ZnTe, CdS, CdSe, organic semiconductor materials including dyes may be used and deposited in numerous ways.

Two further embodiments of the invention will now be described with reference to FIGS. 7 and 8. The device shown in FIG. 7 in part cross-section is a field effect controlled image intensifier panel comprising a glass substrate 31 of approximately 5 mm. thickness having an interdigital electrode pattern thereon consisting of aluminium layers 32 of 2,000 A thickness and 40 microns width and semi-transparent tin oxide electrode layers 33 of approximately 1 micron thickness and 300 microns width, the pitch distances between the electrode layers 32 and 33 being 250 microns. On the glass substrate 31 and covering the electrode layers 32 and 33 there is a D.C. electroluminescence layer consisting of zinc sulphide grains with a copper sulphide coating in an epoxy binder. The layer 34 has a thickness of approximately 10 to 15 microns. On the layer 34 there is a photoconductive layer 35 of between 1 and 5 microns thickness and consisting of a layer of contacting zinc oxide powder grains in which at least at the surface regions of the grains adjacent the interface regions at the grain to grain contacts there is a coating of lead iodide, the powder layer including the coated grains being provided by a method as peviously described.

In the operation of this 'two terminal' device the charging of the zinc oxide powder layer is by a mechanism as described with reference to FIGS. 1 to 3, the charging potential pulses, for example of 300 to 400 volts and 1 to 50 milliseconds duration being periodically applied via the interdigital electrode layers 32 and 33. Due to the geometry of the layer 34 and electrode layers 32, 33 the dominant current flow between adjoining electrode layers 32 and 33 occurs transversely across the layer 34 and then laterally in the zinc oxide powder layer 35, the dominant current conduction paths in the layer 35 being via the interface regions at the grain to grain contacts and in a preferred operational mode the charging pulse being of sufficient magnitude to cause said paths to be blocked. Radiation, from the scene to be viewed, which is incident at the upper surface of the zinc oxide layer 35 has the already described effect when absorbed in the layer 35 of locally discharging the grains at the interface regions at the grain to grain contacts by an amount dependent upon the intensity of the incident radiation and the time of incidence since the previous charging pulse. The application of a D.C. voltage of approximately 200 to 300 volts of the correct polarity between the electrode layers 31 and 32 provides for D.C. electroluminescence in the layer 34 adjacent the positive electrode layer 33. The density is determined by the conductivity of the adjoining portion of the zinc oxide layer 35 via the dominant current conduction paths in said layer 35 via the current between adjoining electrode layers 32 and 33 has to pass. The conductivity in said portion of the layer 35 is dependent on the charge state at the grain to grain contacts as determined by the local intensity of incident radiation following the application of the charging potential pulse. Due to the rectifying nature of the D.C. electroluminescence layer after a voltage 'forming' treatment and the greater electroluminoscent efficiency of this layer when the reading voltage is applied in the corresponding reverse direction it is advantageous to apply the resetting pulse for the zinc oxide with such polarity that the zinc sulphide layer is forward biased. There is then firstly a smaller voltage drop across the zinc sulphide layer and secondly less light emission from the zinc sulphide layer during the resetting pulse.

In a typical image intensifier panel the area is 15 cm. × 15 cm. This type of voltage pulse reset panel thus needs to have only two electrodes to which both the reset pulse and the reading voltage are applied. The choice of a D.C. electroluminescence layer for the output rather than an A.C. electroluminescence layer is preferred because the series impedance of an A.C. electroluminescence layer, for example of zinc sulphide, may not permit a sufficiently large resetting charging pulse to be applied. In any event the duration of the resetting charging pulse must be a small fraction of the frame period and any emission from the layer 34 during the application of said pulse must be relatively small compared with the total emission during the frame period. Optical feedback from the visibly emitting electroluminescence layer to the near ultra-violet sensitive zinc oxide layer is not important. However when using for the layer 35 an alternative to zinc oxide grains such as lead oxide grains or lead iodide grains, then prevention of optical feedbck by an opaque layer between the input and output stages is essential. Methods of achieving the necessary transverse conductivity but avoiding lateral conductivity using material such as graphite are well established.

In the embodiment now to be described with reference to FIG. 8 some of the difficulties associated with resetting the zinc oxide layer by applying the pulse in series with the electroluminescence layer are at least partially avoided. The device shown in part section is a field effect controlled image intensifier panel comprising a glass substrate 41 of 5.0 mm. thickness, a semi-transparent electrode layer 42 of tin oxide of 1.0 micron thickness, a conventional A.C. electroluminescence layer of zinc sulphide of 10 to 15 microns thickness, a zinc oxide powder layer of approximately 1 to 5 microns thickness and of the form described in which the grain surfaces are coated with a layer of p-tpye semiconductor, for example lead iodide, and interdigital electrode layers 46 and 47 consisting of tin oxide each having in the section shown a width of 40 microns and a separation of 40 microns. In the operation of this device the charging of the zinc oxide layer is by means of voltage pulses of 250 volts and 10 milliseconds duration applied via the interdigital electrodes 46 and 47. The output A.C. electroluminescence display is obtained by applying an alternating voltage of 500 volts R.M.S between the electrode layer 42 and the electrode layers 46 and 47. In this device the resetting pulse is applied in the plane of the layer in order to control the conductivity of the layer through the thickness of the layer.

Figure 7:
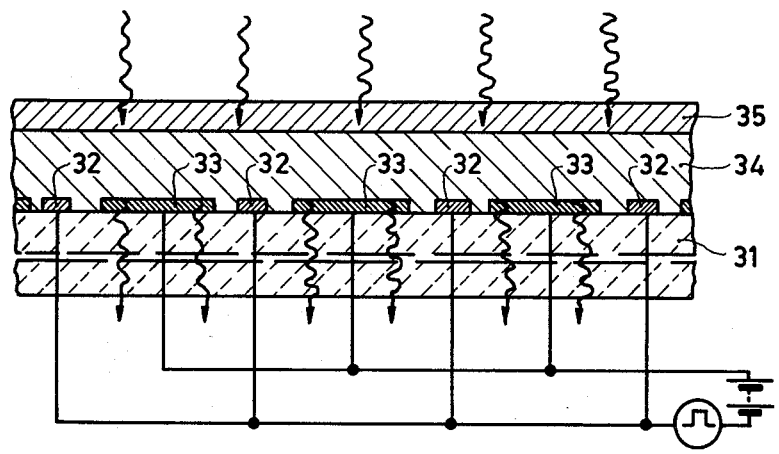
FIGS. 7 and 8 show in cross-section part of the two different image intensifier devices in accordance with the invention.
Figure 8:
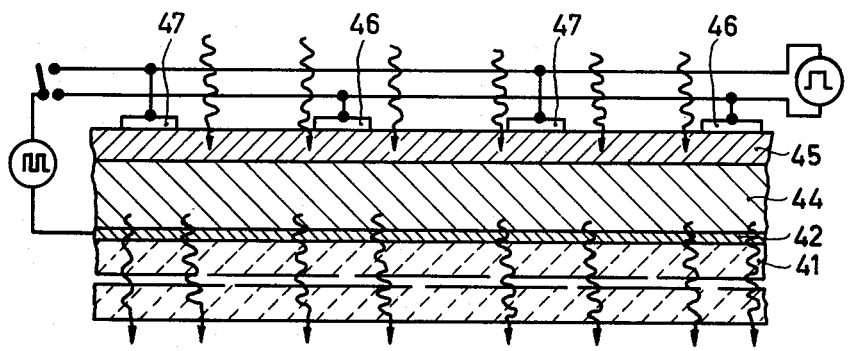

It will be appreciated that the sensitivity of the image intensifier panels such as shown in FIGS. 7 and 8 will be influenced by the impedance mismatch between the zinc oxide and zinc sulphide layers. The matching and hence the sensitivity may be improved by increasing the conductivity of the zinc oxide layer in the working range, for example by heating the powder layer at a higher temperature and at least approaching a sintering temperature when forming the desired configuration of grain to grain contacts, or by increasing the carrier concentration. The use of an A.C. electroluminescence layer instead of a D.C. electroluminescence layer makes better matching easier.

Devices in accordance with the invention comprising at least one layer of semiconductor grains may be considered in a wide variety of different forms. Thus as already described they may be employed in imaging applications and for photodetection. Another application is in electrophotography where a charged layer may be subjected, following exposure, to toner particles. Other applications where the depletion of the dominant current conduction paths in the layer is by one of the said adsorbed species at the grain sufaces are in gas detection and possibly gas transport as previously mentioned. However within the scope of the invention there is also included a semiconductor device in the form of a simple photoconductive layer comprising the grains of semiconductor material having the said intergrain contacts and associated means enabling charge storage at least locally adjacent the interface regions at the grain to grain contacts. Such a single element powder photodetector is potentially more versatile than existing photoconductors because when operated in a charge storage mode there exists the possibility of external control of gain and response time.

Other potential areas of employment of a device structure in accordance with the invention are in (a) voltage variable capacitors where the capacitance of a powder layer may be controlled by charging the surface of coated grains, (b) printed active and passive microcircuit components based on semiconductor powder layers, (e) photocathodes having a high gain comprising a photoconductor powder layer of the novel structure in series with an electron emitting layer, (d) vidicon camera tube targets having a high gain, (e) image converter devices based on field effect conductivity control and of the form where a relatively low energy electron beam is used to selectively address a previously charged photoconductive layer of powder grains which is provided in series with an electroluminescent layer, (f) adjustable voltage dependent resistors based on semiconductor powder layers where presetting of the characteristics may be obtained by charging of the grain to grain contacts, (g) electronic switching devices based on pulse setting of the conductivity of a powder layer, (h) electronically controlled catalysts for chemical process control where catalytic activity associated with gas adsorption and desorption is controlled by biassing a powder layer, and (i) memory devices employing modified conductivity due to charge storage.

What is claimed is:

1. An electronic solid state device comprising an inhomogeneous body including a plurality of grains of semiconductor material, said grains positioned so as to adjoin each other to provide continuity of electrical conduction paths between the bulk material of adjoining grains, the dominant current conduction paths in said body passing through the interface regions between adjacent grains at grain to grain contacts, charge storage enabling means formed within said body at the surfaces of said grains at least locally adjoining but not interrupting said interface regions, and means contacting said charge storage enabling means for enabling the control of electrical conductivity of at least a portion of said body by surface field effect depletion of said conduction paths between adjoining grains in said interface region.

2. An electronic solid state device as claimed in claim 1, wherein the device is constructed for operation in a charge storage mode and comprises electrode means for applying a suitable potential pulse for charging the body in the vicinity of at least some of the grain to grain contacts and for deriving an output indicative of the electrical conductivity of at least a portion of the body as determined by the charge thus stored therein.

3. An electronic solid state device as claimed in claim 1, wherein the material is present as a relatively high resistivity material substantially filling the intergrain spaces in the body.

4. An electronic solid state device as claimed in claim 1, wherein the body comprises grains of n-type zinc oxide at least locally coated with a material selected from the group consisting of p-type lead iodide, p-type lead oxide, p-type cuprous oxide, and p-type zinc telluride.

5. An electronic solid state device as claimed in claim 1, wherein the body comprises grains of p-type lead iodide at least locally coated with n-type zinc oxide or n-type lead oxide.

6. An electronic solid state device as claimed in claim 1, wherein the body comprises grains of n-type cadmium sulphide at least locally coated with a material selected from the group consisting of p-type cuprous sulphide, p-type zinc telluride, and p-type lead iodide.

7. An electronic solid state device as claimed in claim 1, wherein the body comprises grains of p-type zinc telluride at least locally coated with a material selected from the group consisting of n-type cadmium sulphide, n-type zinc selenide, n-type zinc oxide, and n-type lead oxide.

8. An electronic solid state device as claimed in claim 1, wherein the body comprises contacted grains of n-type zinc oxide or n-type cadmium sulphide and the intergrain spaces are substantially filled with high resistivity p-type zinc telluride.

9. An electronic solid state device as claimed in claim 1, wherein the body comprises contacted grains of p-type zinc telluride and the intergrain spaces are substantially filled with a high resistivity material selected from the group consisting of n-type cadmium sulphide and n-type zinc selenide.

10. An electronic solid state device as claimed in claim 1, wherein the applied material present at least locally on the grain surfaces is of semiconductor material of the same conductivity type as the material of the grains but of different composition.

11. An electronic solid state device as claimed in claim 1, wherein the body comprises grains of n-type zinc oxide having a rectifiying heterojunction forming applied coating of n-type cadmium sulphide or n-type zinc selenide.

12. An electronic solid state device as claimed in claim 1, wherein the body comprises grains of p-type zinc telluride having a rectifiying heterojunction forming applied coating of p-type cuprous oxide.

13. An electronic device as claimed in claim 3, wherein the body comprises grains at least locally coated with an organic dye.

14. An electronic solid state device as claimed in claim 1, wherein the charge storage enabling means comprise at least on the surface portions of the grains adjoining the interface regions at the grain to grain contacts at least one adsorbed gas species selected from the group consisting of atoms, ions and molecules, the electrochemical potential of the adsorbed species being greater than or less than that of the material of the grains in accordance with the grains being of n-type or p-type material respectively.

15. An electronic solid state device as claimed in claim 14, wherein the grains are of n-type zinc oxide and the adsorbed species consists of oxygen ions.

16. An electronic solid state device as claimed in claim 1, wherein in addition to the applied coating on the grain surfaces the charge storage enabling means further comprise adsorbed gas ions, molecules or atoms on the surface of the applied coating.

17. An electronic solid state device as claimed in claim 16, wherein the grains are of zinc oxide having on the surface at least adjoining the interface regions at the grain to grain contacts a coating of p-type lead iodide on the surface of which adsorbed oxygen ions are present.

18. An electronic solid state device as claimed in claim 1, wherein in addition to the applied coating on the grain surfaces the charge storage enabling means further comprise gas ions, molecules, or atoms diffused within the coating material.

19. An electronic solid state device as claimed in claim 1, wherein the device is an image intensifier panel of which the body comprising the contacted grains is in the form of an input photoconductive layer for receiving incident radiation and is provided on an output layer.

20. The device of claim 1, wherein said charge storage enabling means comprises a layer of semiconductor material on the surfaces of said grains, said layer being of a conductivity type opposite that of said grains.

* * * * *